(12) United States Patent
Jaiswal et al.

(10) Patent No.: US 6,664,166 B1
(45) Date of Patent: Dec. 16, 2003

(54) CONTROL OF NICHORME RESISTOR TEMPERATURE COEFFICIENT USING RF PLASMA SPUTTER ETCH

(75) Inventors: Rajneesh Jaiswal, Tucson, AZ (US); Chandrakant Patadia, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/242,892

(22) Filed: Sep. 13, 2002

(51) Int. Cl.$^7$ ................................................ H01L 27/02

(52) U.S. Cl. ....................................... 438/382; 438/385

(58) Field of Search .......................... 438/238, 381–385

(56) References Cited

U.S. PATENT DOCUMENTS 4,746,896 A * 5/1988 Mcquaid et al. ............ 338/314

* cited by examiner

Primary Examiner—Jey Tsai
(74) Attorney, Agent, or Firm—W. Daniel Swayze, Jr.; W. James Brady; Frederick J. Telecky, Jr.

(57) ABSTRACT

A method for processing a partially fabricated semiconductor wafer having a layer of nichrome resistor material patterned to form a plurality of nichrome resistors on a surface of the wafer includes performing a wet pre-metallization cleaning step on the wafer surface, performing an RF argon plasma sputter etching process on the wafer surface, advancing the wafer into a second reactor without breaking a vacuum in either reactor, depositing a layer of metal on the surface, patterning the metal to form a predetermined metal interconnection pattern thereof, performing a stabilization bake cycles on the wafer, measuring the TCR of the nichrome resistor material, and rejecting the wafer if the measured TCR is greater than a predetermined value.

12 Claims, 3 Drawing Sheets

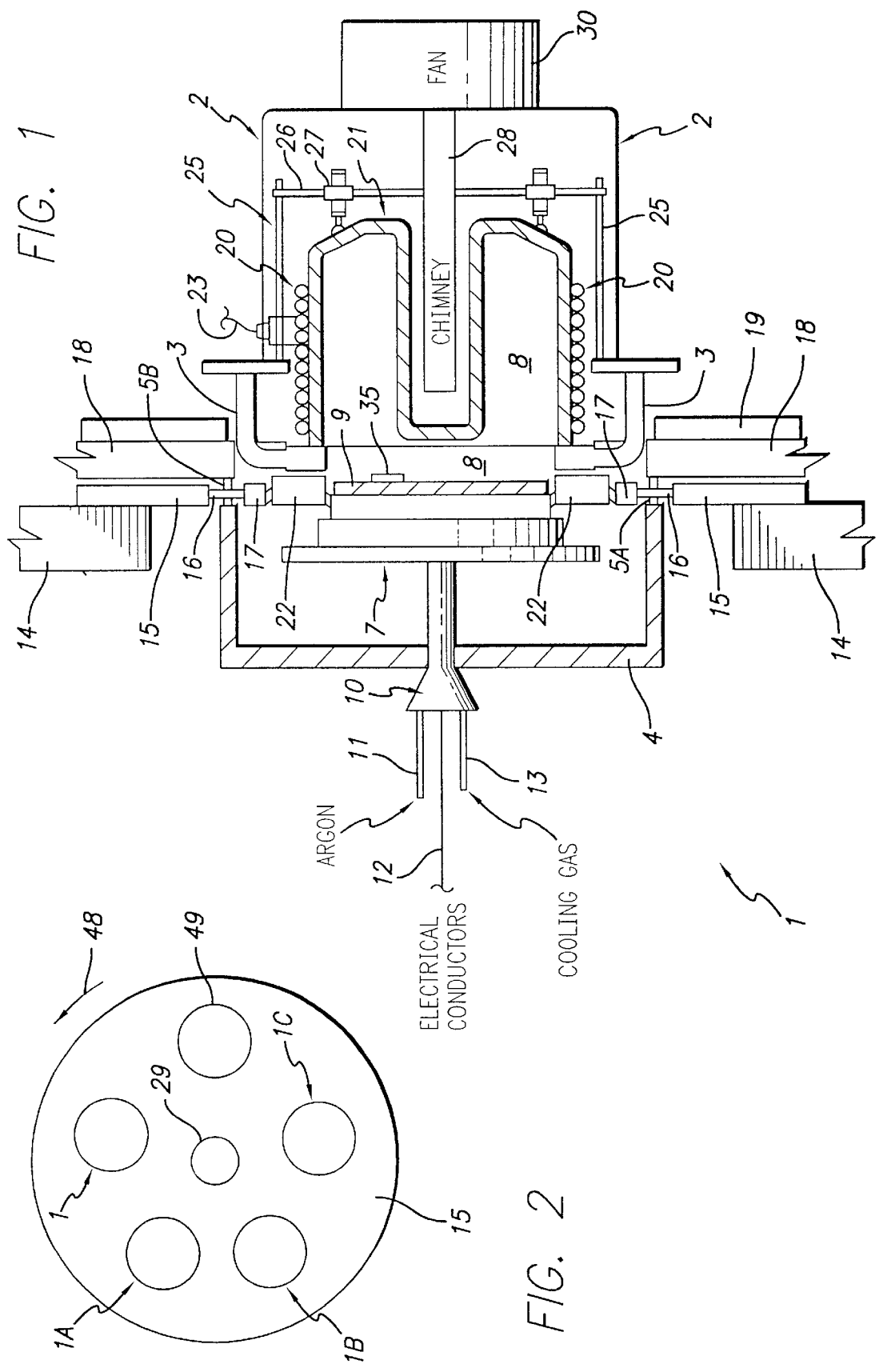

CONTROL OF NICHORME RESISTOR TEMPERATURE COEFFICIENT USING RF PLASMA SPUTTER ETCH

BACKGROUND OF THE INVENTION

The present invention relates generally to manufacture of integrated circuits, and more particularly to minimization and stabilization of the temperature coefficient of nichrome resistors formed on integrated circuits.

It is well known that the resistances of nichrome thin film resistors formed on integrated circuit wafers undergo substantial shifts. The TCR (temperature coefficient of resistance) of the nichrome material is one of the ways in which this shift can be quantified. The nichrome material is a nickel chromium oxide that is deposited as a thin film on the semiconductor wafer during the wafer fabrication process and then baked in a nitrogen-oxygen environment to cause the sheet resistance of the film to attain a certain value. After wafer fabrication is complete, the wafer is transferred to an electrical testing facility. After electrical testing, the wafers are transferred to a packaging facility wherein the individual integrated circuit chips (die) are separated and packaged before final testing. Many integrated circuits are designed with a requirement that the TCR of nichrome resistors thereon be less than a specified maximum value.

The largest shift in the TCR of nichrome resistors usually occurs during the packaging of individual integrated circuit chips after the integrated circuit wafer fabrication and laser trimming of the nichrome resistors is complete. The TCR of a particular wafer fabrication process used by the present assignee is usually roughly 30 ppm (parts per million)/° C. The above described TCR shifts in the nichrome resistors usually are positive shifts. The amount of the shift due to the packaging environment typically is highly variable from day to day (and even from hour to hour), for reasons that are neither well understood nor presently controllable, apparently because the "interactions" of the nichrome material with various aspects of the wafer fabrication processes and the subsequent packaging processes are highly variable.

If the TCR shifts could be reliably minimized or made slightly negative, this would make it possible to greatly reduce the number of wafers rejected at the end of the wafer fabrication process, and therefore would make it possible to greatly reduce the economic loss associated with the rejection of such wafers.

The above described TCR shift may be very problematic because wafer fabrication facilities usually establish a certain specification for the maximum acceptable TCR of the nichrome resistors of a particular integrated circuit product.

In the known wafer fabrication process, which is subsequently described in more detail with reference to the process flowchart of FIG. 4, the TCR of the nichrome resistors of each wafer is measured before the wafers are transferred to the electrical testing facility. If the measured TCR of the nichrome on a semiconductor wafer, which typically includes hundreds of integrated circuit chips, exceeds a maximum specified TCR (referred to herein as $TCR_{MAX}$), the entire wafer must be scrapped consequently, the very large economic cost that has been incurred in fabricating the wafer up to that point is lost.

The TCR measurements are made after the wafers are baked or stabilized prior to the passivation process. The values of sheet resistance of the nichrome material on the wafers are probed and measured at 45 degrees Centigrade. Then the wafers are heated and the sheet resistance values are measured again at 145 degrees Centigrade. The value of the TCR then is computed from the two sheet resistance measurements. If the computed value of the TCR of the wafer is not within the specified limits established for the integrated circuits under consideration, the wafer will be rejected.

RF plasma sputter etching techniques are commonly utilized in manufacture of integrated circuit wafers to pre-clean wafers prior to metal deposition on integrated circuit wafers being manufactured. See "Silicon Processing for VLSI Era" by S. Wolf, Process Integration, 2000, Page 108, Lettuce Press. RF plasma sputter etching is a process wherein an inductively coupled power supply provides energy to a coil wound around a reactor chamber to produce a medium frequency plasma of argon in a reaction chamber. RF power is applied to a chuck which supports a wafer and produces an RF bias that causes the Ar+ ions to impinge on the surfaces of the wafer and remove contaminant material therefrom.

Thus, there is an unmet need for a procedure which lowers the TCR of nichrome resistors and which can be easily incorporated in standard or conventional integrated circuit wafer manufacturing processes.

There also is an unmet need for a procedure which lowers and stabilizes the TCR of nichrome resistors and which can be easily incorporated in standard integrated circuit wafer manufacturing processes.

SUMMARY OF THE INVENTION

It is an object of the present invention to provide a method for lowering the TCR of nichrome resistors.

It is another object of the present invention to provide a method for lowering the TCR of nichrome resistors, which method can be easily incorporated in a standard integrated circuit wafer manufacturing process.

It is another object of the present invention to provide a method for lowering and/stabilizing the TCR of nichrome resistors, which method can be easily incorporated in a standard integrated circuit wafer manufacturing process.

It is another object of the present invention to provide a method for lowering/stabilizing the TCR of nichrome resistors by a fixed amount.

It is another object of the present invention to provide a method for lowering/stabilizing the TCR of resistors other than nichrome resistors.

Briefly described, and in accordance with one embodiment, the present invention provides a method for processing a partially fabricated semiconductor wafer having a layer of resistor material patterned to form a plurality of resistors on a surface of the wafer, the method including performing a wet pre-metallization cleaning step on the surface of the wafer, performing an RF plasma sputter etching process on the surface of the wafer in the first reactor, advancing the wafer from the first reactor into a second reactor while maintaining unbroken vacuum conditions in the first and second reactors, and depositing a layer of metal on the surface of the wafer in the second reactor. The metal then is patterned to form a predetermined metal interconnection pattern. A stabilization bake cycle then is performed on the wafer. The TCR of the resistor material is measured, and the wafer is rejected if the measured TCR is greater than a predetermined value, but otherwise fabrication of the wafer is completed. In the described method, the resistor material is composed of nichrome. Argon gas is passed into the first reactor with the wafer therein, and an inductively coupled power supply produces argon plasma in the first reactor adjacent to the surface of the wafer. An RF bias signal is applied to the wafer to cause argon ions to impinge on the surface of the wafer and remove contaminant material therefrom. The RF plasma etching is performed for approximately 15–30 seconds. with the wafer at a temperature of approximately 400 degrees Centigrade. The RF signal has a voltage of approximately 100 volts and a frequency of approximately 13.5 MHz and causes the wafer to attract the argon ions. The argon plasma is generated by means of an inductive coil wound around a reaction chamber of the first reactor by applying a medium frequency power supply signal having a frequency of approximately 100 kHz across the inductive coil.

BRIEF DESCRIPTION OF THE DRAWINGS

FIG. 1 is a simplified section view of a prior art RF plasma sputter etching reactor in which the RF plasma sputter etching process of the present invention is performed.

FIG. 2 is a simplified section view of the index wheel 15 of the reactor in FIG. 1 illustrating its relationship to multiple reactors into which wafers supported by index wheel 15 can be sequentially advanced without breaking the vacuum in the reactors.

DETAILED DESCRIPTION OF THE PREFERRED EMBODIMENTS

Figure 3:
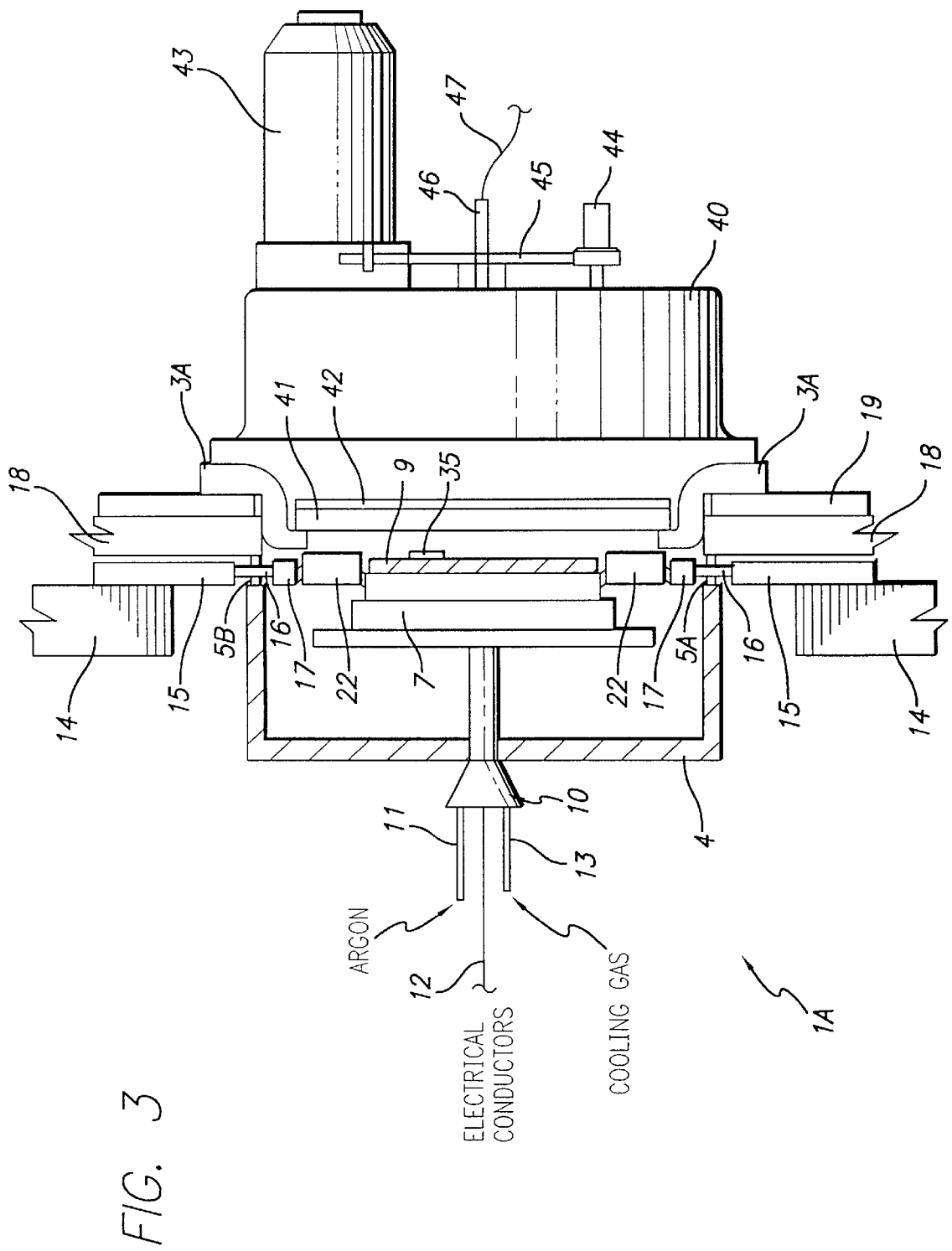
FIG. 3 is a simplified section view of a prior art sputter deposition reactor into which the wafer 9 is moved for metal deposition after the RF plasma sputter etching process is performed.

Referring to FIG. 1, a sectional view of an RF plasma sputter etch system 1 is shown in which the RF plasma sputter etch process of the present invention is performed. Reactor 1 is a "pre clean" reactor or "soft etch chamber" of the "TEL MARK II" system that is commercially available from Tokyo Electron Arizona, Inc. The three key components of the reactor are a heated back plane assembly 7, a wafer holder 22, and a bell jar 21. Back plane assembly 7 contains a heater element (not shown), a feed through connection 13 for the "backside" gas, and conductors 12 to receive an RF bias signal. A 4-inch diameter wafer 9, which is vertically supported in a wafer holder 22, is introduced (as subsequently explained) into a vacuum chamber 8 of reactor 1. Wafer 9 has one or more nichrome resistors 35 on the surface of wafer 9 which is exposed when wafer 9 is supported vertically as shown in FIG. 1.

Wafer holder 22 is one of five wafer holders that are supported by an index wheel 15, which is also shown in FIG. 2. Wafer holder 22 provides a coupling between wafer 9 and backplane assembly 7. The backside gas supplied through tube 13 provides a thermal coupling between the heated backplane assembly 7 and wafer 9. The backside gas can be used to provide convective cooling or heating of wafer 9.

Referring to FIG. 2, index wheel 15 and its five wafer holders 22 can be rotated about an axle 29 in the direction of arrow 48 to advance the various wafers into the four reactors 1, 1A, 1B and 1C included in the above mentioned TEL MARK II system to align the wafers with the chambers of the four reactors, including the above described "soft etch chamber" reactor 1 of FIG. 1 and a "sputter deposition chamber" reactor 1A indicated in FIG. 2 and shown in detail in FIG. 3. Reference numeral 49 designates a "load lock" passage through which each wafer is introduced into or removed from the TEL MARK II system. The various wafers supported by index wheel 15 are also advanced into the two additional reactors 1B and 1C after being processed in the first two reactors 1 and 1A.

Figure 4:
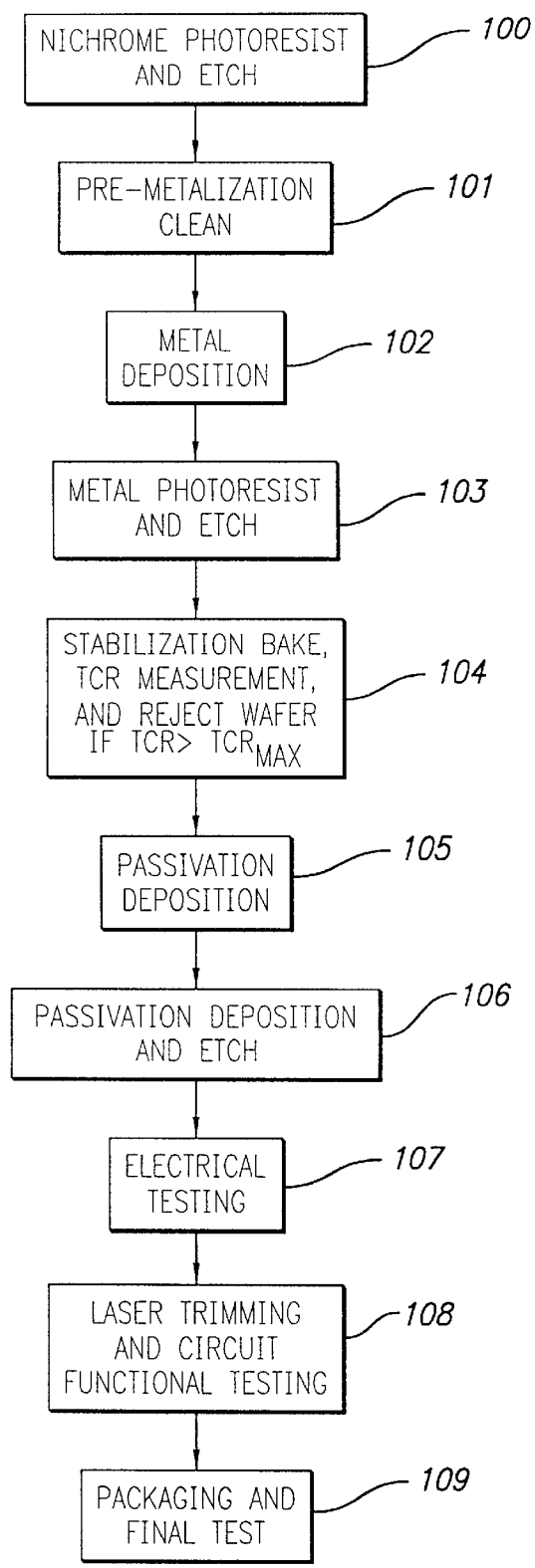
FIG. 4 is a simplified flowchart illustrating prior art manufacture of an integrated circuit wafer having nichrome resistors thereon.
Figure 5:
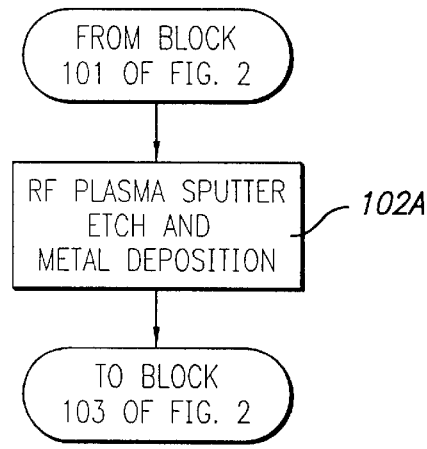
FIG. 5 shows a modification to the prior art process of FIG. 4 to include RF plasma sputter etching of thin film nichrome resistor material according to the present invention.

Sputter deposition chamber 1A is part of the TEL MARK II system available from Tokyo Electron Arizona, Inc., and is used for sputter deposition of the aluminum metallization referred to in block 102A of the process flow chart of FIG. 5, after the conventional wet pre-metallization cleaning step referred to in block 101 of FIG. 4. Sputter deposition chamber 1A is similar in many respects to reactor 1 of FIG. 1, but includes an aluminum target source 41 having a copper back plate 42, and also includes a drive motor 43 which is used in conjunction with a drive belt 45 and pulley assembly 44 to drive a "magnet pack"(not shown) within cathode assembly 40 to rotate the magnet pack at a particular rate, in order to obtain good uniformity during aluminum deposition.

Thus, index wheel 15 can be rotated to advance each wafer into the next reaction chamber, and a fixed plenum 14 associated with each reaction chamber and a movable plenum 18 associated with each station on index wheel 15 perform the functions of sealing and unsealing the various wafers supported by index wheel 15 while maintaining unbroken vacuum conditions in each of the four reaction chambers, which are used to successively perform different processing functions on the wafers as they are advanced. The detailed function of each part shown in FIG. 1 can be obtained from the Tokyo Electron Limited operation manual and Tokyo Electron Limited patents on the soft etch chamber.

When argon is introduced into reaction chamber 8 of reactor 1, an inductively coupled power supply producing a power signal having a frequency of approximately 100 kHz is applied to coil 20 by conductors 23. This causes an argon plasma to be produced in reaction chamber 8 adjacent to the exposed surface of wafer 9. RF power is applied to back plane assembly 7 via conductors 12 and also is applied via back plane assembly 7 to wafer 9. This causes wafer 9 to attract Ar+ ions of the plasma during the negative portion of each RF cycle, causing the Ar+ ions to impinge on the outer surface of wafer 9 and, in accordance with the present invention, thereby remove (i.e., etch) contaminant material from the surfaces of nichrome resistors (such as resistor 35 in FIG. 1) previously formed thereon. The material removed from the surface of wafer 9 sticks to the inside surface of bell jar 21. After the RF plasma etch of the present invention has been performed in reactor 1, index wheel 15 is rotated to advance wafer 9 from reactor 1 into the reaction chamber of reactor 1A without breaking the vacuum in either reactor 1 or reactor 1A. The sputter deposition of aluminum from aluminum source 41 onto wafer 9 then is performed.

The frequency and voltage of the RF signal applied to wafer 9 via conductors 12 and backplane assembly 7 can be approximately 13.5 MHz and approximately 100 volts, respectively, although the bias voltage can vary from approximately 100 to 300 volts. The flow rate of the argon gas entering the above described reaction chamber 8 can be approximately 25 standard cubic centimeters per minute. The wafer temperature established by the heated back plane assembly 7 can be approximately 100 to 400° C. The duration of an RF plasma sputter etching resulting from the application of the RF signal applied via electrical conductors 12 to wafer 9 via conductors 12 and backplane assembly 7 can be approximately 15–30 seconds.

As indicated later in Table 1, introduction of the RF plasma sputter etch process of the present invention has been found to reliably reduce the TCR of nichrome resistors by roughly 30 ppm, and this has the effect of stabilizing the TCR by reducing it to a level that substantially reduces the number of wafers that have to be rejected in an integrated circuit wafer fabrication facility.

FIG. 4 is a flow chart that illustrates a relevant portion of a conventional wafer fabrication process, electrical testing, and packaging for an integrated circuit product that is performed after various conventional insulative oxide layers, various doped layers have been formed in and/or on the upper surface of semiconductor wafer 9, and after a thin film of nichrome material has been deposited on the upper surface of wafer 9.

Referring to FIG. 4, the conventional patterning of a photoresist layer and subsequent conventional etching are performed in order to define the shapes of one or more nichrome resistors 35 that are formed from the thin film of nichrome material, as indicated in block 100. Then a pre-metallization wet cleaning step is performed, as indicated block 101. Next, interconnection metallization (typically aluminum) is deposited on the exposed surface of wafer 9 in bell jar 21 of processing system 1, as indicated block 102.

Next, as indicated in block 103 of FIG. 4, conventional patterning of a photoresist layer and subsequent conventional etching of the deposited aluminum metallization are performed to define the shapes of the aluminum interconnection metallization of the integrated circuit.

Next, as indicated in block 104 of FIG. 4, the conventional wafer fabrication process includes stabilization of resistors 35 on wafer 9. This is accomplished by performing multiple bake cycles in air on the wafers at 510 degrees Centigrade to cause the sheet resistances of the resistors 35 to reach certain a designated value. The sheet resistances of pre-selected resistors on wafer 9 then are measured at 45 degrees Centigrade and 145 degrees Centigrade (although the sheet resistance measurements could be made at other temperatures). The value of the TCR of the resistors is calculated according to the expression:

$$TCR(ppm) = \{(Rs_{145\ degrees} - Rs_{45\ degrees}) * 10^6\} / (Rs_{45\ degrees} * 100),$$

where $Rs_{145\ degrees}$ and $Rs_{45\ degrees}$ are the sheet resistances of the nichrome material at 145° C. and 45° C., respectively.

The wafers having a TCR value greater than a maximum value $TCR_{MAX}$ specified for the above mentioned designated value of sheet resistance are rejected and scrapped.

After stabilization, a silicon dioxide passivation layer is deposited on the remaining wafers, as indicated in block 105. Then the passivation layer is patterned by conventional photoresist and etching steps, as indicated in block 106. The fabricated wafers then are transferred to an electrical testing facility, and electrical parameters of the integrated circuits are tested, as indicated in block 107 of FIG. 4. Next, the nichrome resistors 32 on the wafers 9 are laser trimmed to very precise resistance values, as indicated in block 108. Then, overall electrical circuit functionality of each chip is tested after the nichrome resistors are laser trimmed, as also indicated in block 108. Next, the wafers are transferred to a packaging facility where the wafers are sawed into individual chips (die). The usual die attach, wire bonding, and final test operations then are performed, as indicated in block 109.

Referring next to FIG. 5, the RF plasma sputter etching process of the present invention is performed in system 1 of FIG. 1 immediately after the wet pre-metallization cleaning process of block 101 of FIG. 4 and immediately before the deposition of the aluminum metallization of block 102 of FIG. 4, as indicated in block 102A of FIG. 5.

Several experiments were performed between September, 2001 and February, 2002 wherein each experiment included a number of wafers fabricated essentially identically (i.e., fabricated in the same lot), except that some of the wafers in each lot were additionally subjected to the RF plasma sputter etch process in accordance with the present invention. Table 1 shows the average TCR of the wafers in each group which were subjected to the RF plasma sputter etch and also shows the average TCR of the wafers in each group which were not subjected to the RF plasma sputter etch.

TABLE 1

| Group Number | TCR without RF Etch | TCR with RF Etch | TCR Shift |
| --- | --- | --- | --- |
| 1 | +9.8 ppm | −17.2 ppm | −27.0 ppm |
| 2 | +9.3 ppm | −21.3 ppm | −30.6 ppm |
| 3 | +62.3 ppm | +33 ppm | −29.3 ppm |
| 4 | +62.3 ppm | +28.7 ppm | −33.6 ppm |

As can be seen from the results in Table 1, adding the RF plasma sputter etch step to the wafer fabrication process consistently reduced the TCR by roughly 30 ppm.

The above described RF plasma sputter etching process is believed to contribute to the observed reduction and stabilization of the TCR of nichrome resistors as a result of several mechanisms. The first mechanism is the removal of an "oxygen skin"(adsorbed oxygen) on the surface of the nichrome resistors. The adsorbed oxygen occurs because chromium is very sensitive to oxidation, and getters oxygen at room temperature. However, the amount of adsorbed oxygen is highly variable, which causes the above mentioned high variability of the TCR of the nichrome resistors 35. Removal of the adsorbed oxygen during the RF sputter plasma etching process before in situ deposition of the aluminum metallization that makes electrical contact to terminals of the nichrome resistor material enhances the free (i.e., non-oxidized) chromium content of the nichrome in the aluminum-nichrome contact region. The $Cr_2O_3$ interface that usually is formed by the prior art process at the aluminum-nichrome contact interface is eliminated, and consequently no chromium is consumed by formation of $Cr_2O_3$ during the later stabilization bake cycles because the interface between the aluminum metallization and the nichrome is effectively sealed. The resulting higher chromium content in the nichrome film leads to a reduction in the TCR of the nichrome resistors.

Another mechanism is thought to be that the RF plasma sputter etching process improves electrical contact between the nichrome and the aluminum metallization at the nichrome resistor-aluminum contact areas, because without any $Cr_2O_3$ barrier, some aluminum alloying into the nichrome at the contact area occurs during the later bake stabilization process. The small amount of aluminum alloy resulting from a clean interface contact area between the aluminum and the nichrome results in lower, more consistent contact resistance, and consequently contributes to a reduction in the TCR of the nichrome resistors.

Also, the RF sputter plasma etching process reduces the thickness of the nichrome film, and this results in a reduction of the TCR of the nichrome resistors 35 due to activated tunneling of charge carriers across small gaps between nichrome islands in the $Cr_2O_3$ formed during the stabilization bake. This is required because $Cr_2O_3$ is formed again during the stabilization bake in all areas except the contact area, since in the new process the contacts have been sealed with in situ aluminum deposition after the RF plasma sputter etch.

Note that it is believed that a more detailed study is needed to quantify the individual contributions of each of the above mechanisms to the reduction of the TCR of the nichrome resistors.

The above described RF plasma sputter etch process performed on nichrome resistors has been found to substantially eliminate the above mentioned day-to-day variability of TCR measurements for nichrome resistors.

The above described process of the present invention is easily incorporated in pre-existing semiconductor manufacturing processes, without changes being required in the composition of the nichrome film material. Manufacture of integrated circuits having nichrome resistors with a TCR stability of 25 ppm is feasible using the above described RF plasma sputter etching process, and this substantially reduces the number of rejected wafers prior to packaging due to TCR shift instability as a result of the packaging process and hence avoids the associated economic loss.

Furthermore, it has been found that the magnitude of the field threshold voltage of the semiconductor wafers is increased by the described RF plasma sputter etching process, and also that the contact resistance between interconnect metallization and the various doped semiconductor regions is decreased by the described RF plasma sputter etching process. The RF sputter etching process tends to clean the field oxide surface of any contaminants, thereby reducing associated charge effects and consequently increasing the field threshold voltage. The RF sputter etching process also helps to remove any native oxide or polymer material in the silicon-aluminum contact region, and thereby allows good silicon-to-aluminum alloying, which results in lower, more reliable contact resistance.

While the invention has been described with reference to several particular embodiments thereof, those skilled in the art will be able to make the various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, it is possible that the same mechanisms believed to lower or stabilize the TCR in nichrome in film layers could also provide the same stabilization in other thin films than nichrome. The RF sputter plasma etching process of the present invention is equally applicable to nichrome films manufactured in MOS or CMOS manufacturing processes, as well as to bipolar manufacturing processes. Other temperatures, time durations, voltages, signal frequencies, wafer sizes, and the like could be used instead of the exemplary values used in the above described preferred embodiment of the invention.

What is claimed is:

1. A method for processing a partially fabricated semiconductor wafer having a layer of resistor material patterned to form a resistor on a surface of the wafer, the method comprising:

(a) performing a wet pre-metallization cleaning step on the surface of the wafer;

(b) performing an RF plasma sputter etching process on the surface of the wafer in a first reactor;

(c) advancing the wafer from the first reactor into a second reactor while maintaining unbroken vacuum conditions in the first and second reactors;

(d) depositing a layer of metal on the surface of the wafer in the second reactor;

(e) patterning the metal to form a predetermined metal interconnection pattern thereof;

(f) performing a stabilization bake cycle on the wafer, measuring the TCR of the resistor material, and rejecting the wafer if the measured TCR is greater than a predetermined value; and (g) completing fabrication of the wafer.

2. The method of claim 1 wherein the resistor material is composed of nichrome.

3. The method of claim 2 wherein step (b) is performed by passing argon gas into the first reactor with the wafer therein and producing an argon plasma in the first reactor adjacent to the surface of the wafer, and the applying an RF signal to the wafer to cause argon ions to impinge on the surface of the wafer and remove contaminant material therefrom.

4. The method of claim 2 including performing step (b) with the wafer at a temperature of approximately 400 degrees Centigrade.

5. The method of claim 3 including performing step (b) while applying an RF signal of approximately 100 volts and having a frequency of approximately 13.5 MHz to the wafer to cause it to attract the argon ions.

6. The method of claim 5 including performing step (b) for approximately 15–30 seconds.

7. The method of claim 3 wherein step (b) includes providing an argon plasma by means of an inductive coil wound around a reaction chamber of the first reactor by applying a medium frequency power signal across the inductive coil.

8. The method of claim 7 wherein the frequency of the medium frequency power signal is approximately 100 kHz.

9. The method of claim 8 including passing argon gas into the first reactor at a rate of approximately 25 standard cc per minute.

10. A method for processing a partially fabricated semiconductor wafer having a layer of nichrome resistor material patterned to form a plurality of resistors on a surface of the wafer, the method comprising:

(a) performing a wet pre-metallization cleaning step on the surface of the wafer in a first reactor;

(b) passing argon gas into the first reactor with the wafer therein and producing an argon plasma in the first reactor adjacent to the surface of the wafer by applying a power signal having a frequency of approximately 100 kHz to an inductive coil wound around a reaction chamber of the first reactor and the applying an RF signal having a voltage of approximately 100 volts and a frequency of approximately 13.5 MHz to the wafer for approximately 15–30 seconds to cause argon ions to impinge on the surface of the wafer and remove contaminant material therefrom;

(c) advancing the wafer from the first reactor into a second reactor while maintaining unbroken vacuum conditions in the first and second reactors;

(d) depositing a layer of metal on the surface of the wafer in the second reactor;

(e) patterning the metal to form a predetermined metal interconnection pattern thereof;
(f) performing a stabilization bake cycle on the wafer, measuring the TCR of the nichrome resistor material, and rejecting the wafer if the measured TCR is greater than a predetermined value; and
(g) completing fabrication of the wafer.

11. The method of claim 10 including performing step (b) with the wafer at a temperature of approximately 400 degrees Centigrade.

12. The method of claim 11 including passing the argon gas into the first reactor at a rate of approximately 25 standard cubic centimeters per minute.

* * * * *

UNITED STATES PATENT AND TRADEMARK OFFICE
CERTIFICATE OF CORRECTION

PATENT NO.    : 6,664,166 B1  
DATED         : December 16, 2003  
INVENTOR(S)   : Rajneesh Jaiswal et al.

It is certified that error appears in the above-identified patent and that said Letters Patent is hereby corrected as shown below:

<u>Title page,</u>  
Item [54], Title, should read -- CONTROL OF NICHROME RESISTOR TEMPERATURE COEFFICIENT USING RF PLASMA SPUTTER ETCH --.

Signed and Sealed this

Twenty-ninth Day of November, 2005

JON W. DUDAS  
*Director of the United States Patent and Trademark Office*